(12) United States Patent
Liu et al.

(10) Patent No.: US 7,642,570 B2
(45) Date of Patent: Jan. 5, 2010

(54) RESCUE STRUCTURE AND METHOD FOR LASER WELDING

(75) Inventors: Chu-Yu Liu, Hsin-Chu (TW);
Shyh-Feng Chen, Hsin-Chu (TW);
Wen-Bin Chen, Hsin-Chu (TW)

(73) Assignee: AU Optronics Corp., Hsinchu (TW)

( * ) Notice: Subject to any disclaimer, the term of this patent is extended or adjusted under 35 U.S.C. 154(b) by 182 days.

(21) Appl. No.: 11/607,874

(22) Filed: Dec. 4, 2006

(65) Prior Publication Data
US 2007/0262351 A1 Nov. 15, 2007

(30) Foreign Application Priority Data
May 9, 2006 (TW) .............................. 95116460 A

(51) Int. Cl.
*H01L 29/00* (2006.01)
(52) U.S. Cl. ................................ 257/209; 257/E21.592
(58) Field of Classification Search .................... 257/59, 257/72, 209, 208, E23.149, E21.592
See application file for complete search history.

(56) References Cited

U.S. PATENT DOCUMENTS

2004/0174471 A1* 9/2004 Nakanishi et al. .............. 349/93
2005/0285989 A1* 12/2005 Sakurai et al. ................. 349/44

\* cited by examiner

*Primary Examiner*—Sue Purvis
*Assistant Examiner*—Selim Ahmed
(74) *Attorney, Agent, or Firm*—Birch, Stewart, Kolasch & Birch, LLP

(57) ABSTRACT

A rescue structure to repair an open wire includes a first metal layer having at least a rescue line, an isolation layer formed on the first metal layer, and a second metal layer formed on the isolation layer. The second metal layer has at least a signal line crossing the rescue line to form an enlarged intersection node. The intersection node is particularly arranged far from the side where the rescue line is used for signal transmission.

7 Claims, 8 Drawing Sheets

RESCUE STRUCTURE AND METHOD FOR LASER WELDING

BACKGROUND OF THE INVENTION

(1) Field of the Invention

The invention relates to a rescue structure and a method for laser welding, and more particularly to the one that can improve the rescue quality by simplifying the needed rescue process.

(2) Description of the Prior Art

It is well known that the display area of the liquid crystal display (LCD) is formed by crossing a plurality of data lines with a plurality of gate lines. A pixel of the display area is the square area defined by two adjacent data lines and two adjacent gate lines. By providing transistors internally to the pixels and by controlling illumination of the transistors, a predetermined image can thus be displayed.

Referring now to FIG. 1, a schematic view of a typical conventional LCD is shown. The LCD 1 includes a glass substrate 10 having a middle display area formed by intersecting a plurality of data lines and a plurality of gate lines. In the art, the signal line 2 of the LCD 1 can be the data line or the gate line. Yet to simplify the description herein, the signal line 2 is assigned to the data line. A plurality of driver integrated circuits (IC) 3 are located to the rim of the glass substrate 10. Each of the driver ICs 3 is used to control signal flow of one or more than one signal lines 2. A circuit board 4 is located outside the glass substrate 10 for electrically connecting the driver ICs 3 and some external power sources.

Empirically, in the manufacturing process of the signal lines 2, possible particle contamination to break the line is also possible, as area C shown in FIG. 1. As long as the situation of such contamination to break the signal line happens, a repair upon the broken signal line 2 is required so as to activate the pixels located in the downstream of the signal line 2 after the area C.

In the art, to repair contamination in the signal lines, some rescue lines are usually included in the LCD 1, such as rescue lines R1 and R2 in FIG. 1. The rescue line R1 or R2, crossing the signal line in a projection wise, is located at a metal layer of the glass substrate 10 different to the layer that lies the signal lines 2. Generally, the rescue line R1 or R2 is constructed at the first metal layer M1, while the signal lines 2 are constructed at a second metal layer M2. The first metal layer M1 and the second metal layer M2 are separated by an isolation layer in between. As shown, the rescue line R1 or R2 is extended along the rim of the glass substrate 10, and, by passing through the pass inside the driver IC 3 and lines 5, 6 or 5a, 6a of the circuit board 4, connected to an end of the respective signal line 2.

For example, in the case that point P of the signal line 2 is a broken point and needs to be repaired, a typical repair is to engage by laser welding (1) the signal line 2 at area A with the rescue line R1 and (2) the signal line 2 of area B with the rescue line R1, and then signals of the driver IC 3 can be transmitted to the lower-P area of the line 2 via the rescue line R1. Upon such an arrangement, the display at pixels in the lower-P area of the line 2 can be resolved and thus the display quality of the LCD can be greatly improved. Note that the only defect pixel now is the pixel at point P.

Referring now to FIGS. 2A thru 2D, a conventional laser repairing to the area A of the signal line 2 in FIG. 1 is shown. To convene the laser welding, the intersection of the signal line 2 and the rescue line R1 is originally made to a broader welding pad 21. The welding pad 21 is formed by extending sideward the signal line 2 as shown in FIGS. 2A and 2B.

When the laser welding is processed manually, the laser penetrates the welding pad 21 at weld points 8 to integrate metally the upper signal line 2 and the lower rescue line R1. To avoid additional loading resulted from signal transmission to the left side of the rescue line R1 and to reduce the resistance-capacity (RC) value of the LCD, an additional laser cutting 81 to cut the rescue line R1 left to the welding pad 21 is processed, as shown in FIGS. 2C and 2D.

As noted in the art, laser welding and laser cutting are repeated again and again to process the conventional laser rescue. In addition, while in manual laser welding, the welding pad is made broader to ease the manual laser operation. Yet, the increase of the RC value is the trade-off. As a consequence of the aforesaid laser rescue, the signal realization is substantially lowered and the yield of the rescue is also reduced.

Therefore, an improved laser rescue method to increase the rescue yield without sacrificing the RC value is needed.

SUMMARY OF THE INVENTION

Accordingly, it is an object of the present invention to provide a laser rescue structure that won't increase its RC value after a laser rescue welding.

It is an another objective of the present invention to provide a laser rescue method that can simplify the laser rescue process.

In the present invention, the laser rescue structure includes a first metal layer having at least a rescue line, an isolation layer laminated upon the first metal layer, a second metal layer laminated upon the isolation layer. The second metal layer includes at least a signal line crossing spatially with the rescue line of the first metal layer. In the crossing area, an enlarged intersection node is formed at one side of the rescue line, in which the side does not transmit any signals.

The laser rescue structure of the present invention is constructed in the LCD having at least a driver IC connected electrically with one end of the signal line, while another end of the signal line is connected to an electrostatic discharge (ESD) device. In the present invention, the signal line can be a data line connected electrically to a drain of a thin film transistor (TFT) of the LCD. In the present invention, the signal line can also be a gate line connected electrically to a gate of the TFT.

In the present invention, the laser rescue method comprises a step of forming a first metal layer having at least a rescue line, a step of laminating an isolation layer on the first metal layer, a step of laminating a second metal layer on the isolation layer on which at least a signal line is formed by crossing spatially with the rescue line and further in which an enlarged intersection node is formed aside an intersection area of the signal line and the rescue line, and a step of laser welding to cut the rescue line at the intersection node and to connect metally the intersection node with the rescue line at the intersection area. In the present invention, the aforesaid side of the intersection area does not bear any signal transmission.

In the present invention, the intersection node of the laser rescue structure is formed to one side of the signal line. Compared to the conventional welding pad, the intersection node can be made smaller, the RC value thereof can be less affected by the laser welding, and thus the signal realization can be substantially maintained.

Further, the laser rescue method of the present invention is featured in processing the laser welding and cutting only at the intersection node of the signal line, such that one laser step can complete the rescue operation. Therefore, the laser rescue method of the present invention can be successfully simplified.

All these objects are achieved by the rescue structure and method for laser welding described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a rescue structure and a rescue method for laser welding. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Referring now to FIGS. 3A-3D, a preferred laser rescue structure in accordance with the present invention is schematically shown. In particular, the improvement shown herein is directed to modification upon area A of FIG. 1.

Figure 3A:
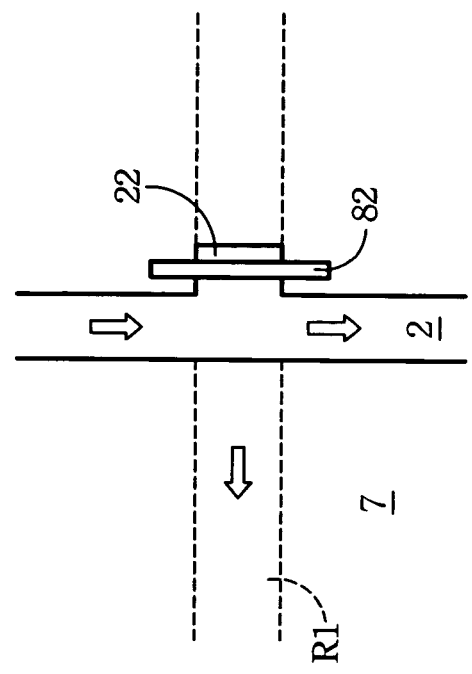
FIGS. 3A-3D show schematically a preferred laser rescue structure in accordance with the present invention.
Figure 3B:
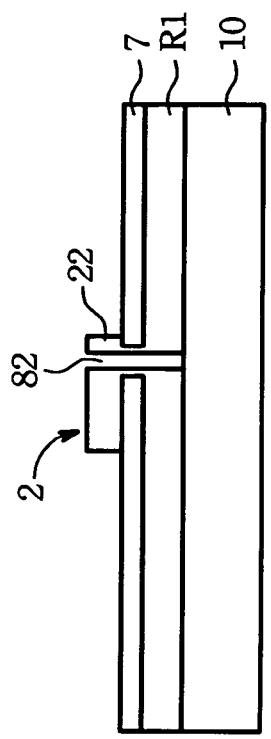

As shown in FIGS. 3A and 3B, the laser rescue structure in accordance with the present invention includes a first metal layer M1 formed on a glass substrate 10 and having at least a rescue line R1, an isolation layer 7 formed on the first metal layer M1, and a second metal layer M2 formed on the isolation layer 7. The second metal layer M2 has at least a signal line 2 crossing the rescue line R1 of the first metal line M1 to form an enlarged intersection node 22 at the intersection area. The intersection node 22 is particularly arranged at the side of the rescue line R1 where no signal transmission is performed, i.e. the right-hand side in the figure.

Figure 3C:
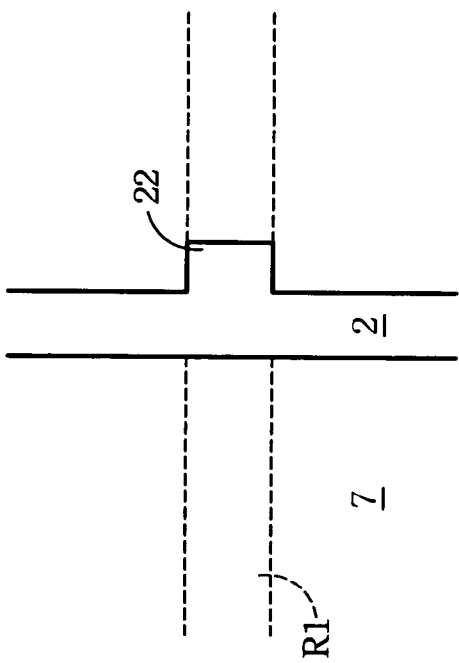
Figure 3D:
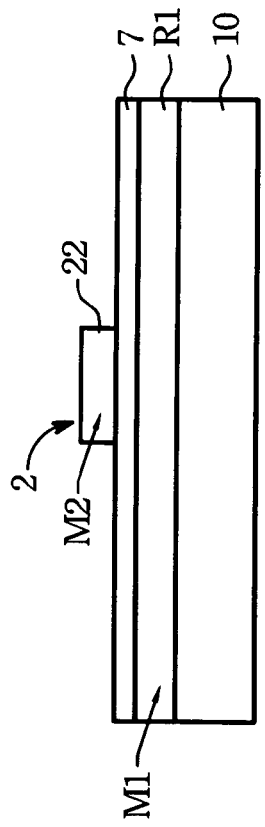

As shown in FIGS. 3C and 3D, in the case that a laser repairing is needed to rescue a broken section at the signal line 2, a laser welding upon the intersection node 22 is the only process to complete the repairing. The laser welding is to electrically connect the signal line 2 to the rescue line R1 at the left-hand side of the figure, but to disconnect the signal line 2 to the rescue line R1 at the right-hand side thereof. In the present invention, the laser welding available can be performed by firstly removing the isolation layer with a low-power laser and secondly welding the intersection node and the rescue line with a high-power laser. Alternatively, the laser welding can be properly arranged to remove the isolation layer and weld the intersection node and the rescue line at a single operation by a proper-power laser. It is to say that the FIG. 3D shows the rescue structure after laser welding. It clear shows that the rescue line R1 disposed on a substrate 10, wherein the rescue line R1 includes a first through slit exposing a part of an upper surface of the substrate. Further, an isolation layer 7 is disposed on the rescue line R1, wherein the isolation layer 7 includes a second through slit formed on the first through slit and exposing the part of the upper surface of the structure 10, and an aperture of the second through slit is a little larger than the first through slit. Furthermore, the signal line 2 is disposed on the isolation layer 7, wherein the signal line 2 includes a third through slit formed on the second through slit and exposing the part of the upper surface of the structure 10, and a portion of the signal line 2 is extending and adhereing to a sidewall of the second through slit to contact the rescue line R1.

Figure 1:
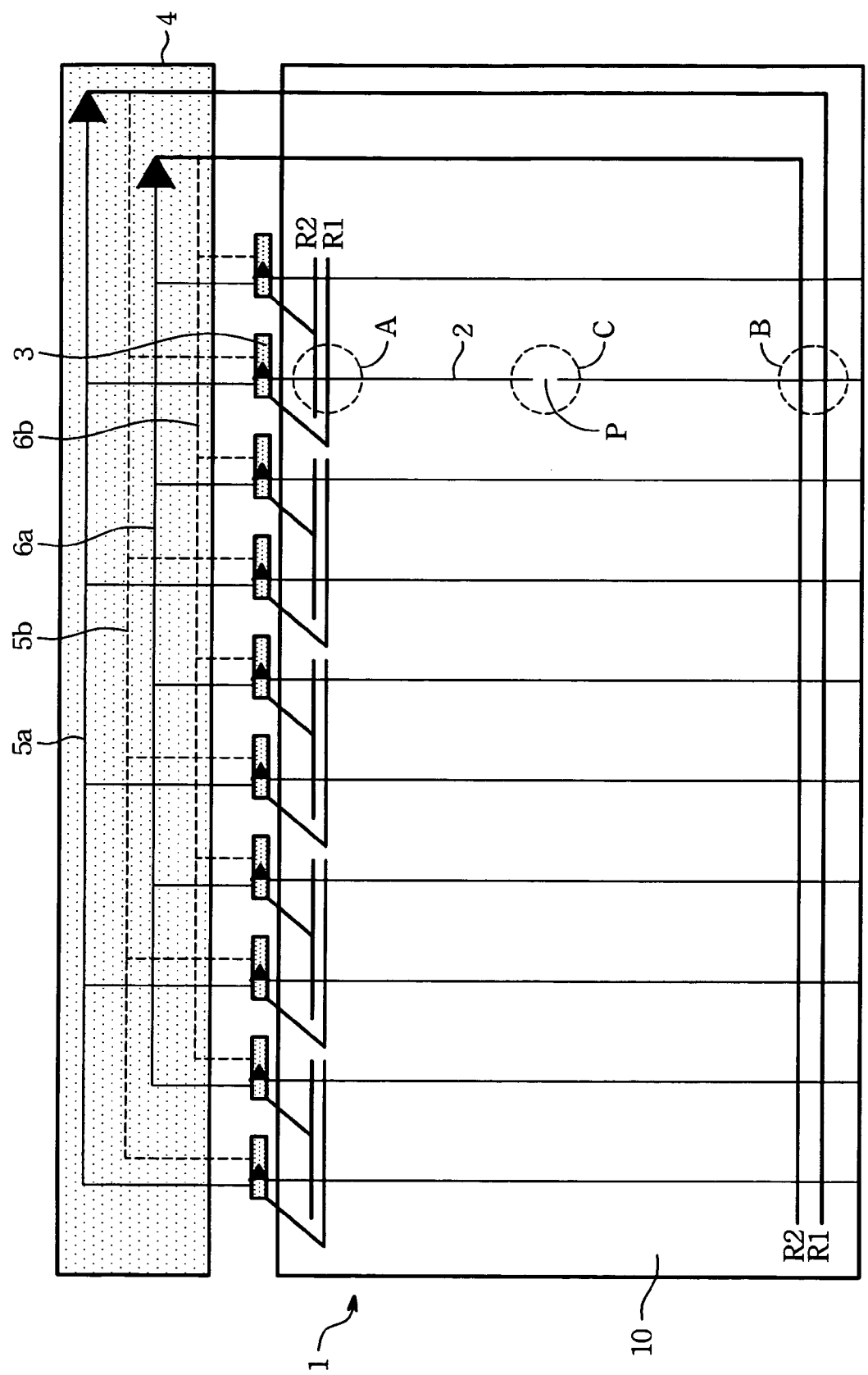
FIG. 1 is a schematic view of a typical conventional LCD.
Figure 2:
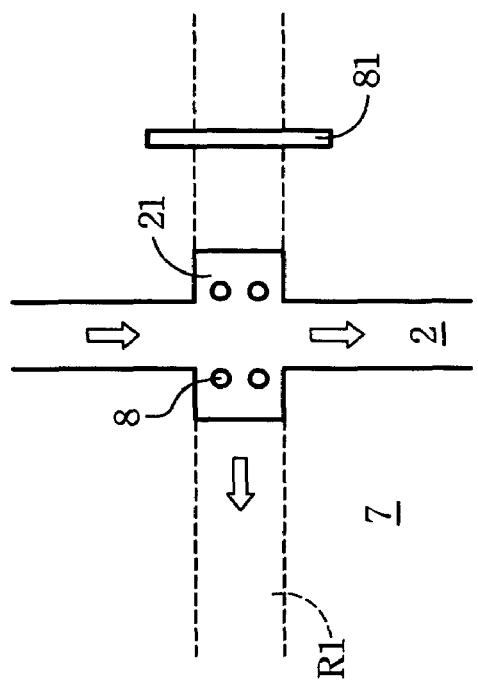
FIGS. 2A-2D show a conventional laser repairing to the area A of the signal line in FIG. 1.
Figure 2:
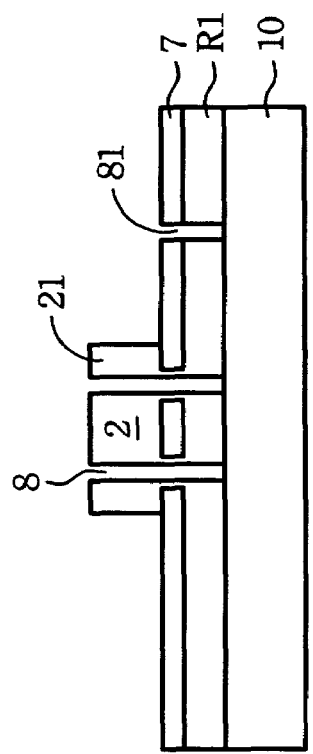
Figure 2:
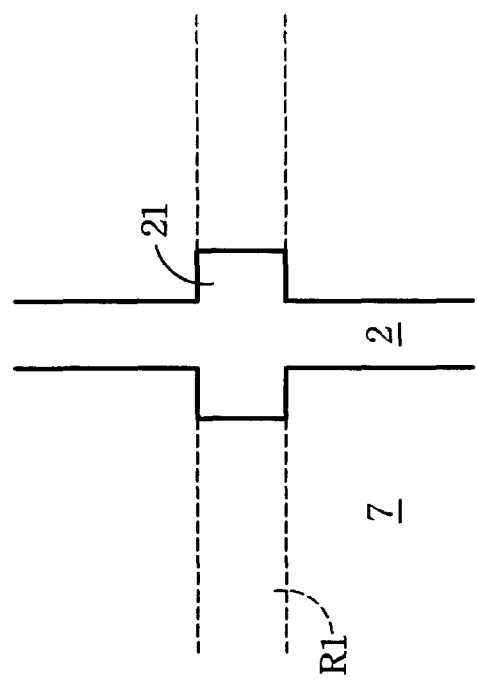
Figure 2:
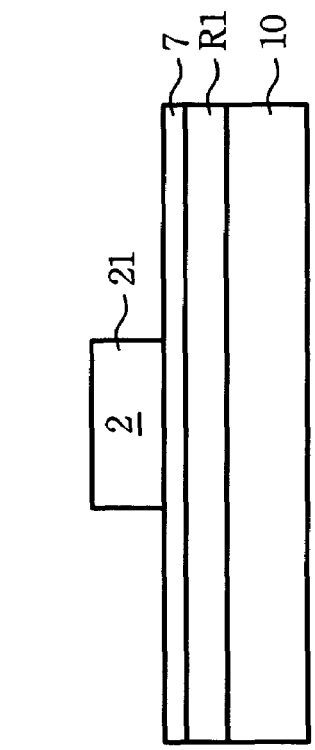
Figure 4B:
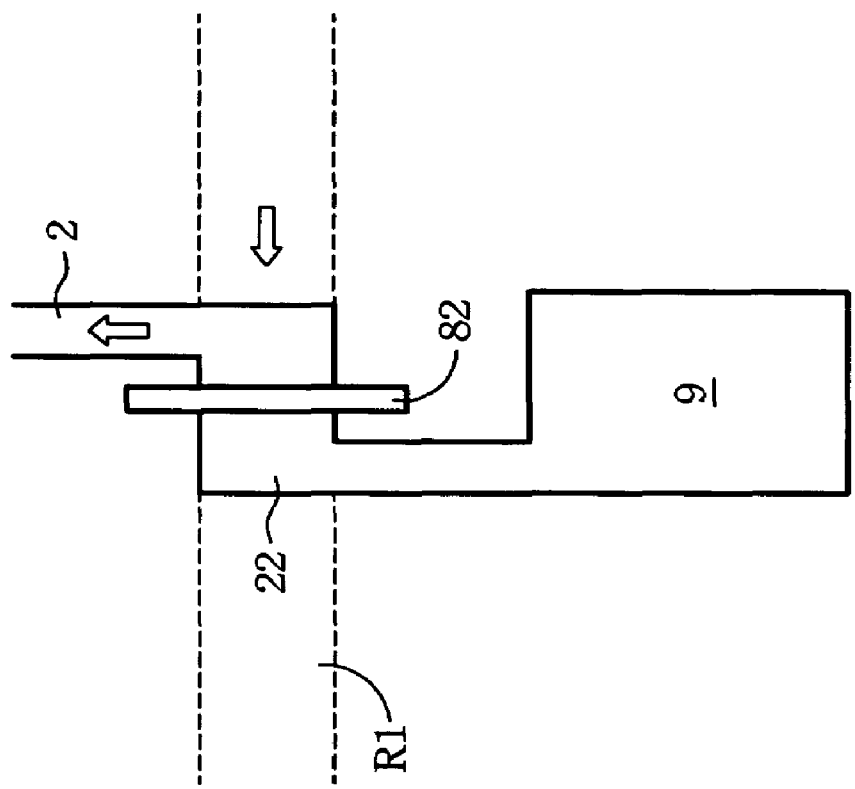
FIGS. 4A-4B show laser rescue structures of the present invention for area B of the signal line in FIG. 1.
Figure 4A:
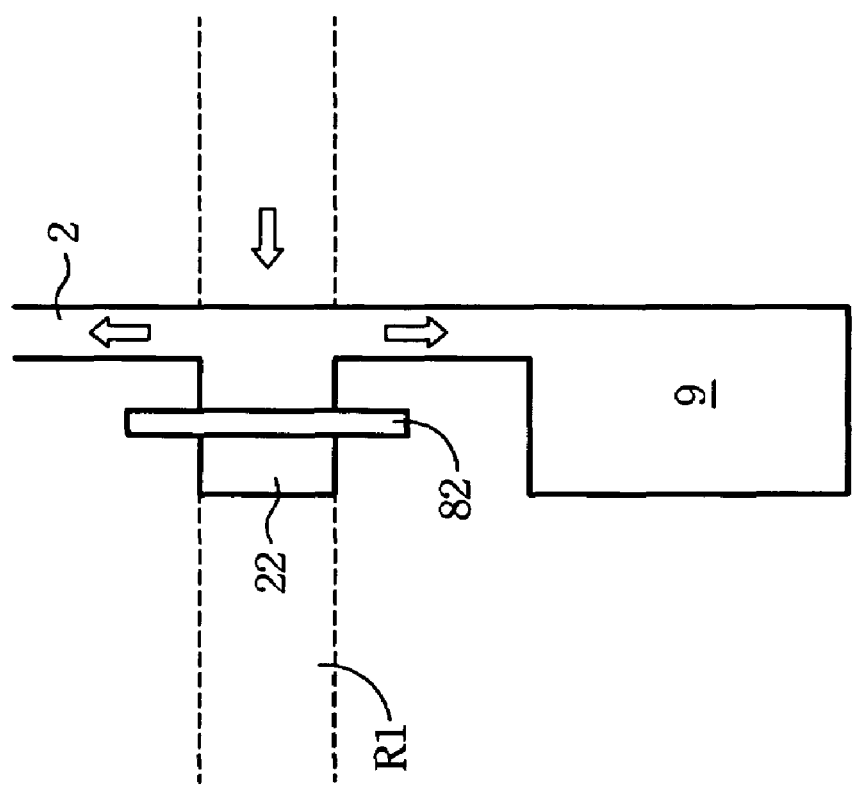

Referring now to FIGS. 4A and 4B, laser rescue structures of the present invention for area B of the signal line in FIG. 1 are schematically shown. One end of the signal line 2 is electrically connected with a driver IC, while another end thereof is electrically connected with an ESD apparatus 9. Such an arrangement of the signal line 2 is to prevent the image of the LCD from being interfered by possible electromagnetic charges. Yet, the existence of the ESD apparatus 9 can increase the RC value of the LCD and thus make worse the decaying of signals.

The rescue structure in FIG. 4A is particularly relevant to a signal line 2 that has a high possibility to be electro-magnetically interfered. The rescue structure can make easy a rescue repairing upon the signal line 2 and can also make the ESD apparatus 9 to normally function. On the other hand, in the case that the signal line 2 needs no concerns upon the electromagnetic discharge, the rescue structure as shown in FIG. 4B can be appropriate. A weld repairing can rescue the signal line 2 and simultaneously cut the connection with the ESD apparatus 9 so as to lower loading of the signal line 2.

Figure 5:
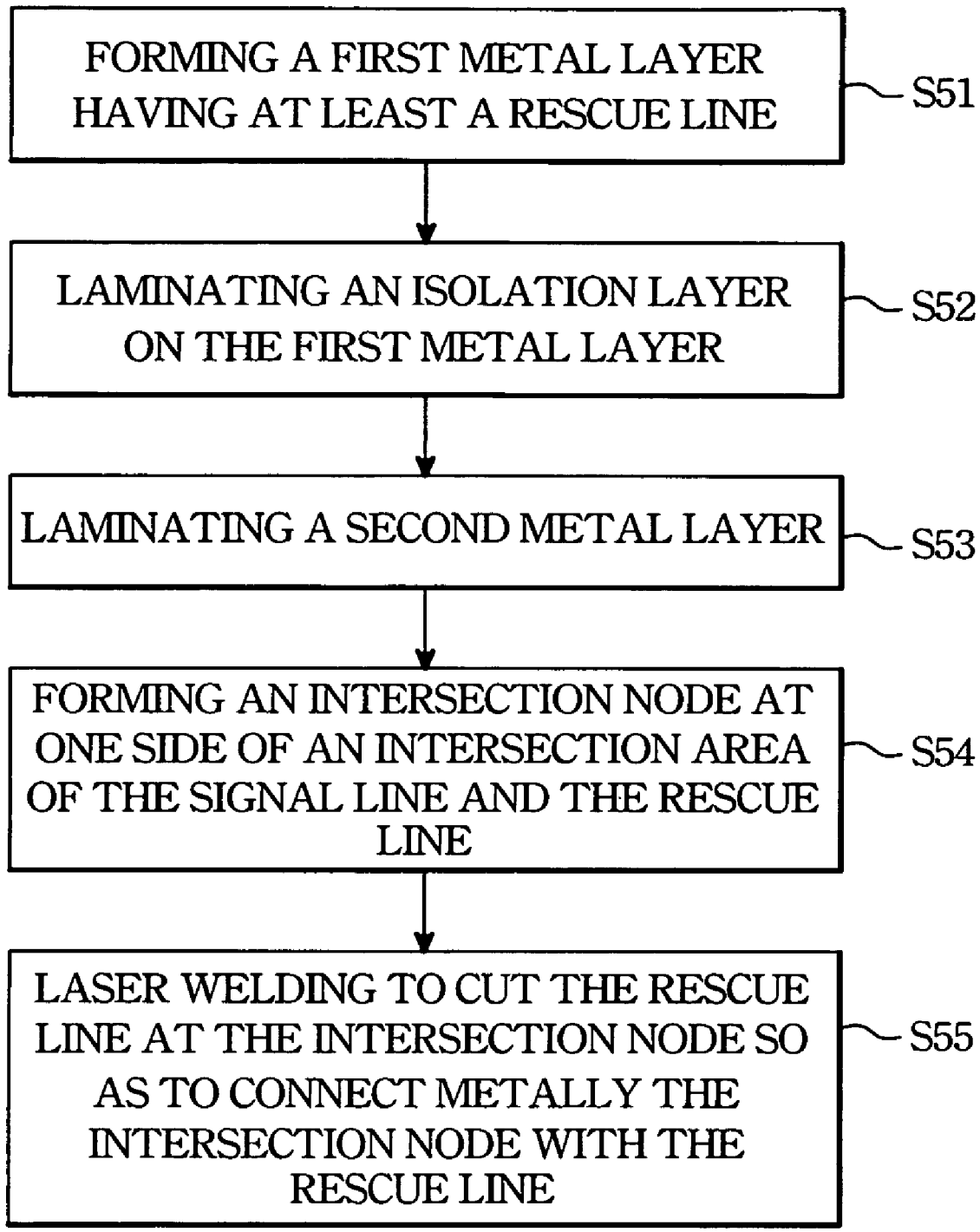
FIG. 5 is a flowchart of a preferred laser rescue method in accordance with the present invention.

Referring now to FIG. 5, a preferred laser rescue method of the present invention comprises a step of forming a first metal layer having at least a rescue line (S51), a step of laminating an isolation layer on the first metal layer (S52), a step of laminating a second metal layer on the isolation layer on which at least a signal line is formed by crossing spatially with the rescue line (S53), a step of forming an enlarged intersection node at one side of an intersection area of the signal line and the rescue line where the side has no signal transmission (S54), and a step of laser welding to cut the rescue line at the intersection node and to connect metally the intersection node with the rescue line at the intersection area (S55). In the present invention, the aforesaid side of the intersection area does not bear any signal transmission.

Similarly, the laser welding available for the aforesaid rescue method can be performed by firstly removing the isolation layer with a low-power laser and secondly welding the intersection node and the rescue line with a high-power laser. Alternatively, the laser welding can be properly arranged to remove the isolation layer and weld the intersection node and the rescue line at a single operation by a proper-power laser.

In the foregoing description, the rescue line and the signal line are crossed spatially. To a structure that the rescue line and the signal line are parallel and overlapping, the rescue structure and method can be modified as follows.

Figure 6:
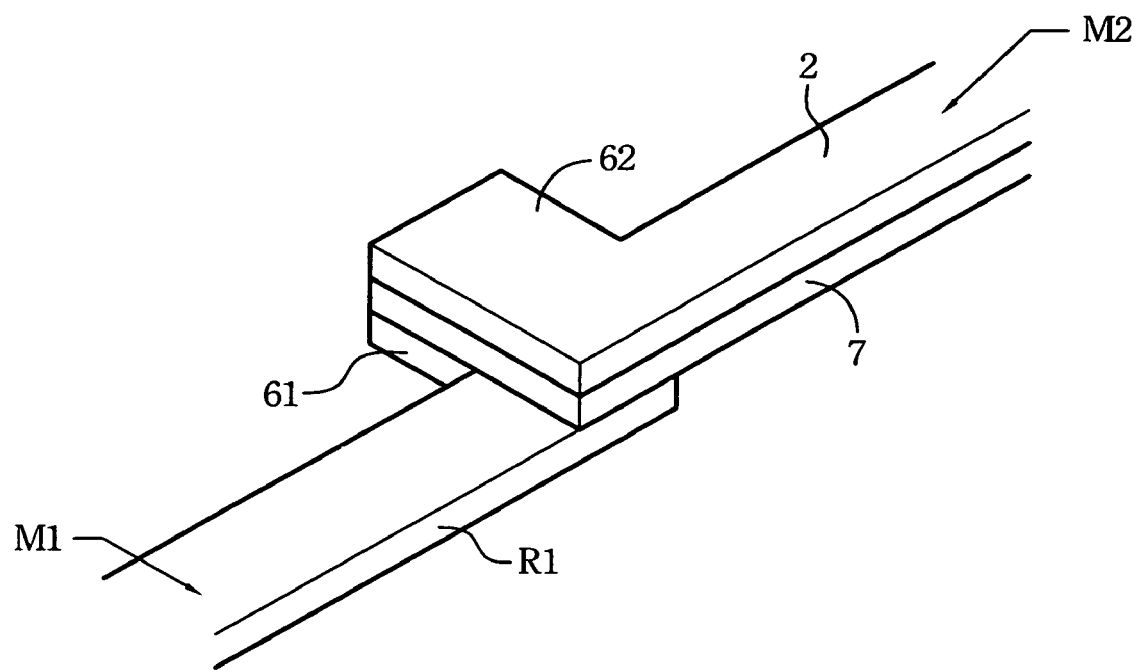
FIGS. 6A-6B show a laser rescue structure having a rescue line parallel to and overlapping with the signal line in accordance with the present invention.
Figure 6:
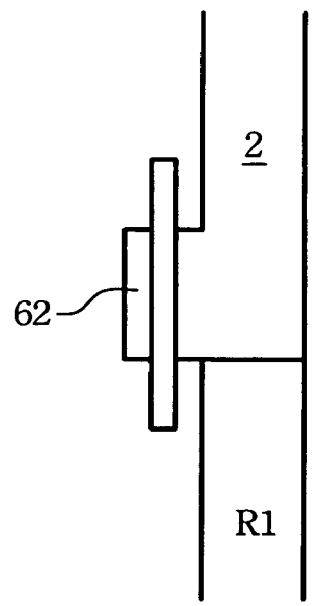

Referring now to FIGS. 6A and 6B, a laser rescue structure having a rescue line R1 parallel to and overlapping with the signal line 2 in accordance with the present invention is shown. The laser rescue structure in accordance with the present invention includes a first metal layer M1 formed on a glass substrate 10 and having at least a rescue line R1 further having a first intersection node 61 at one side thereof, an isolation layer 7 formed on the first metal layer M1, and a second metal layer M2 formed on the isolation layer 7. The second metal layer M2 has at least a signal line 2 and a second intersection node 62. The signal line 2 and the rescue line R1 are parallel and overlapping spatially. In the present invention, the signal line 2 and the rescue line R1 can also are partially parallel and overlapping. When a laser rescue repairing is performed, the laser welding can be focused only on the second intersection node 62 to metally connect the first intersection node 61 and the second intersection node 62, and thus the signal line 2 can connect electrically to the rescue line R1, as shown in FIG. 6B.

Figure 7:
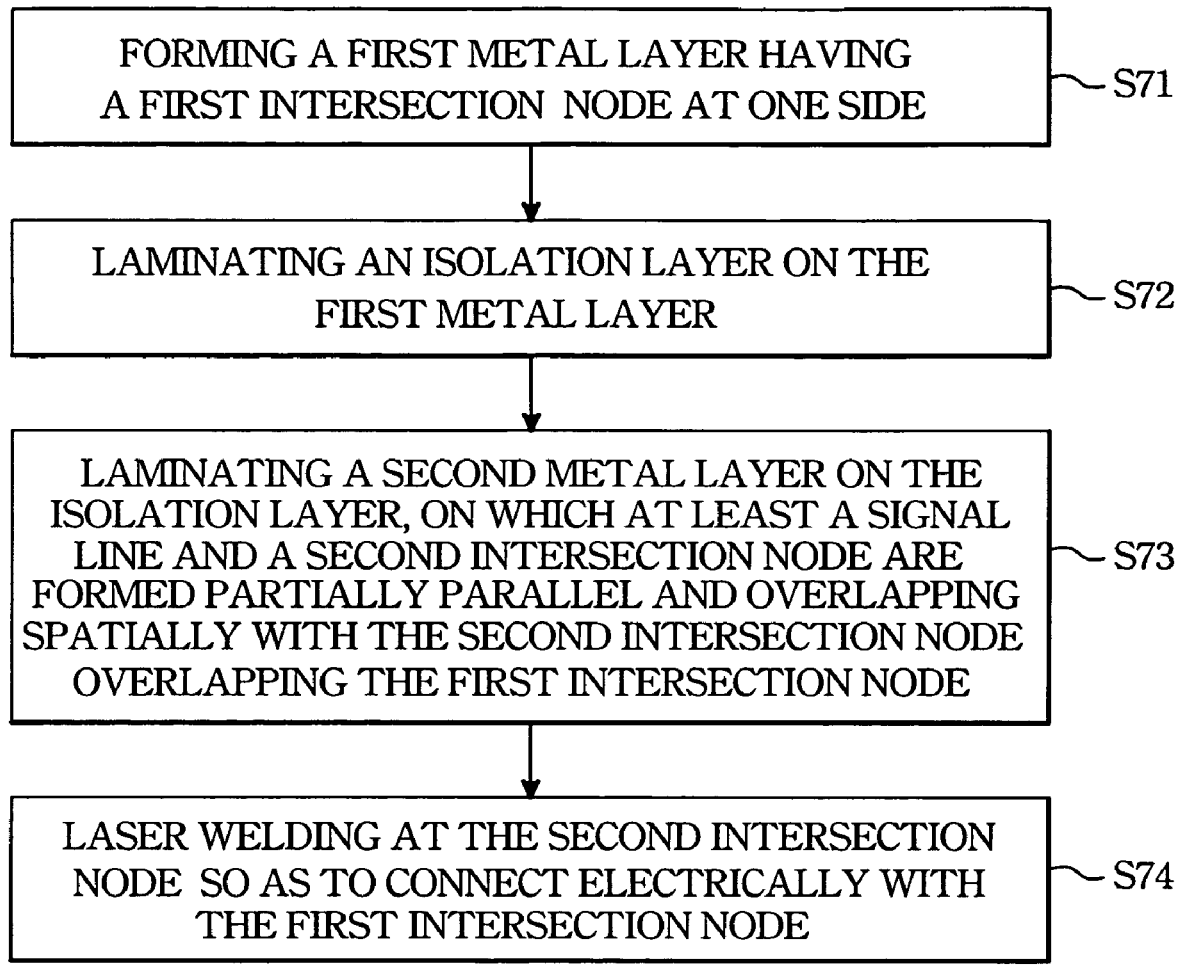
FIG. 7 is a flowchart of a laser rescue method for the laser rescue structure of FIGS. 6A-6B in accordance with the present invention.

Referring now to FIG. 7, a laser rescue method of the present invention for the structure of FIG. 6A comprises a step of forming a first metal layer having at least a rescue line further having a first intersection node at one side thereof (S71), a step of laminating an isolation layer on the first metal layer (S72), a step of laminating a second metal layer on the isolation layer on which at least a signal line and a second intersection node are formed partially parallel and overlapping spatially with the second intersection node overlapping the first intersection node (S73), and a step of laser welding at the second intersection node so as to connect electrically with the first intersection node (S74).

While the present invention has been particularly shown and described with reference to preferred embodiments, it will be understood by those skilled in the art that various changes in form and detail may be without departing from the spirit and scope of the present invention.

Figure 8:
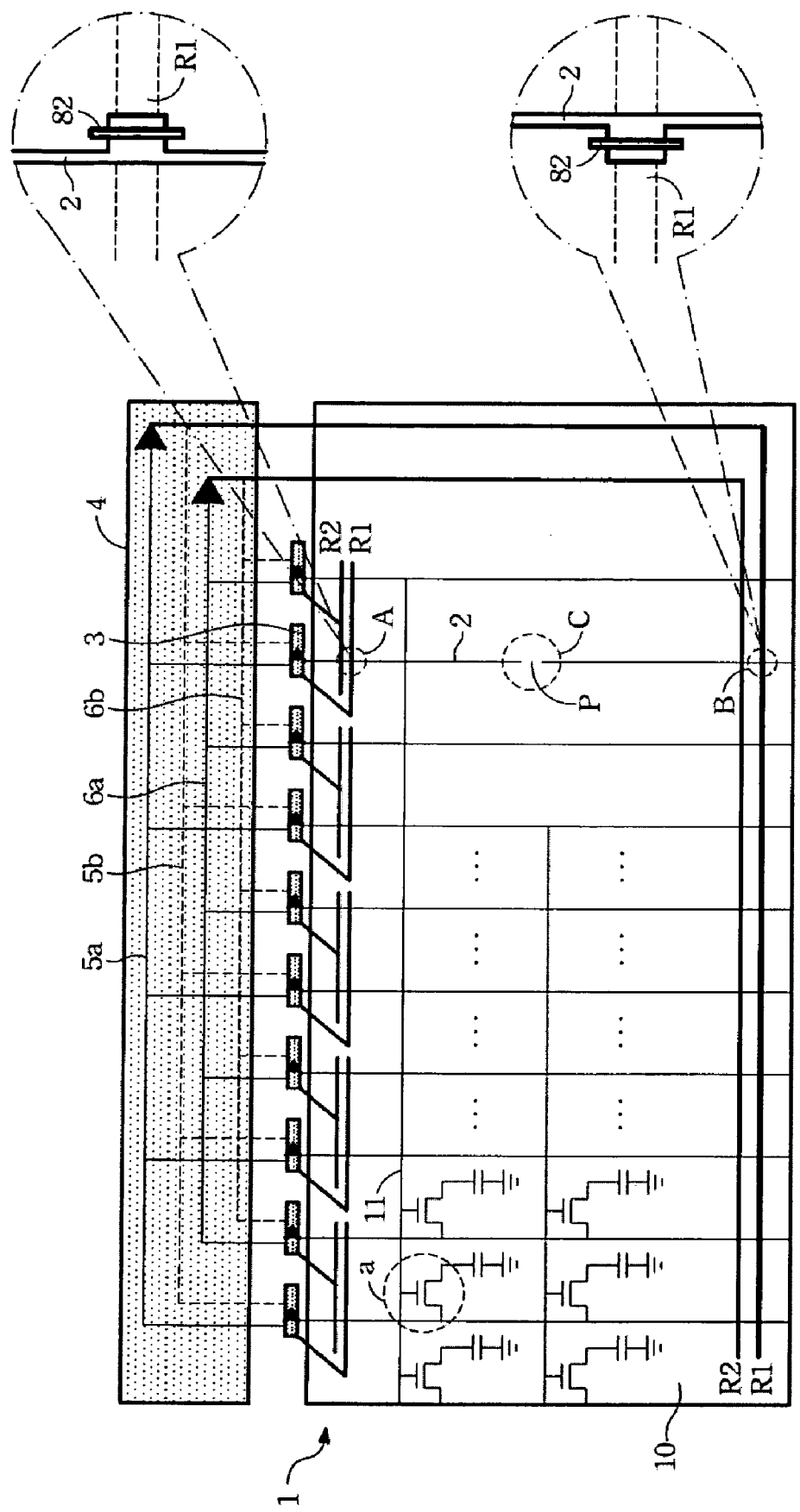
FIG. 8 is a schematic view of a LCD in accordance with the present invention.

Referring now to FIG.8. the laser rescue structures of the present invention for areas A and B of the signal line are shown. FIG. 8 illustrates the laser rescue structure of the present invention, located in a liquid crystal display (LCD) 1, wherein the LCD 1 includes at least a driver IC 3 connected electrically to one end of the data line 2. Further, it also shows that the LCD 1 includes a plurality of thin film transistors in area (a), and the data line 2 is connected electrically to drains of the thin film transistors, and the scan line 11 is connected electrically to gates of the thin film transistors. In FIG.8, a part of thin film transistors are shown.

We claim:

1. A rescue structure, after laser welding, located in a liquid crystal display (LCD), comprising:
   a first metal layer, disposed on a substrate, wherein said first metal layer includes a first through slit exposing a part of an upper surface of said substrate, wherein said first through slit divides said first metal layer into only two separated parts;
   an isolation layer, disposed on said first metal layer, wherein said isolation layer includes a second through slit formed on said first through slit and exposing said part of the upper surface of said structure, and an aperture of the second through slit is a little larger than said first through slit, wherein said second through slit divides said isolation layer into only two separated parts;
   a second metal layer, disposed on said isolation layer, wherein said second metal layer includes a third through slit formed on said second through slit and exposing said part of the upper surface of said structure, and a portion of said second metal layer is extending and adhereing to a sidewall of said second through slit to contact with said first metal layer, wherein said third through slit divides said second metal layer into only two separated parts.

2. The laser rescue structure according to claim 1, wherein a LCD includes at least a driver IC connected electrically to one end of one of the signal line of said second metal layer.

3. The laser rescue structure according to claim 1, wherein the LCD includes at least an ESD apparatus connected electrically to one end of one of the signal line of said second metal layer.

4. The laser rescue structure according to claim 3, wherein the ESD apparatus connects electrically the signal line at one side of said part of the upper surface of said structure.

5. The laser rescue structure according to claim 3, wherein the LCD includes a plurality of thin film transistors, and the signal line is connected electrically to drains of the thin film transistors.

6. The laser rescue structure according to claim 3, wherein the LCD includes a plurality of thin film transistors, and the signal line is connected electrically to gates of the thin film transistors.

7. The laser rescue structure according to claim 1, wherein said first through slit divides said first metal layer into only two separated parts, said second through slit divides said isolation layer into only two separated parts, and said third through slit divides said second metal layer into only two separated parts, therefore there is no signal transmission between two separated parts of said first metal layer, no signal transmission between two separated parts of said isolation layer, and no signal transmission between two separated parts of said second metal layer.

* * * * *